United States Patent [19]

Chen et al.

[11] Patent Number: 4,554,644
[45] Date of Patent: Nov. 19, 1985

[54] STATIC RAM CELL

[75] Inventors: Peter C. Chen, Sunnyvale; Alex Au, Los Altos, both of Calif.

[73] Assignee: Fairchild Camera & Instrument Corporation, Mountain View, Calif.

[21] Appl. No.: 390,082

[22] Filed: Jun. 21, 1982

[51] Int. Cl.[4] ............................................. G11C 11/40
[52] U.S. Cl. ......................................... 365/154; 365/190
[58] Field of Search .................... 365/154, 190, 202

[56] References Cited

U.S. PATENT DOCUMENTS

| 3,772,660 | 11/1973 | Norman | 365/155 |
| 4,247,915 | 1/1981 | Bartlett | 365/154 |
| 4,342,101 | 7/1982 | Edwards | 365/154 |

OTHER PUBLICATIONS

Linton et al., "Low-Power FET Storage Cell", IBM Tech. Disc. Bull., vol. 17, No. 11, Apr. 1975, pp. 3338-3339.
"16-K Static RAM Takes New Route to High Speed", by Rahul Sud and Kim C. Hardee, Electronics, Sep. 11, 1980.
"A 15-ns 1024-Bit Fully Static MOS RAM", Toshio Wada, et al., IEEE Journal of Solid-State Circuits, vol. SC-13, No. 5, Oct. 1978.
"Variable Resistance Polysilicon for High Density CMOS RAM", by T. Iizuka, et al., IEEE 1979, (CH1504-0/79/0000-0370500.75).
"A High Peformance MOS Technology for 16K Static RAM", by S. S. Liu, et al., 1979, IEEE, (CH1504-0/79/0000-0352500.75).
"An 8K×8 Bit Static MOS RAM Fabricated by n--MOS/n-Well CMOS Technology", by T. Ohzone, et al., 1980, IEEE, (0018-9200/80/1000-0854$00.75).
"Composite Silicide Gate Electrodes-Interconnections by VLSI Device Technologies", H. J. Geipel, et al., 1980, IEEE, (0018-9383/80/080-1417$00).

Primary Examiner—Joseph A. Popek
Attorney, Agent, or Firm—Carl Silverman; David H. Carroll; Steven F. Caserza

[57] ABSTRACT

A static RAM cell (11) is constructed utilizing low resistivity positive and negative power supply leads (13,14), thus eliminating the problem of instability of the data stored within the cell. The negative power supply lead is formed of a first layer of low resistivity polycrystalline silicon/tantalum silicide, and the positive power supply lead is formed of a second layer of polycrystalline silicon. The use of a low resistivity negative power supply lead causes the voltage drop on the negative power supply lead to be substantially reduced as compared with prior art devices, thereby providing during the read operation substantially equal voltages to the gates of the two bistable transistors of each cell, thus eliminating the problem of instability during reading.

Depletion load devices (11,12) are formed utilizing the layer of polycrystalline silicon as the source, drain and channel and the layer of polycrystalline silicon/tantalum silicide as the gate. In this manner, silicon area is not required to form the depletion load devices, thus minimizing cell size.

13 Claims, 21 Drawing Figures

STATIC RAM CELL

BACKGROUND OF THE INVENTION

1. Field of the Invention

This invention deals with static random access memory devices.

2. Description of the Prior Art

Static random access memory devices are well known in the prior art. One such prior art memory cell is described in U.S. Pat. No. 3,772,660 issued on an invention of Norman on Nov. 13, 1973 and assigned to Fairchild Camera and Instrument Corporation, the Assignee of this invention, and which is hereby incorporated by reference.

Broadly described, one type of random access memory (RAM) device comprises an array of cells, each cell capable of storing a single binary digit (bit). As described in the above-mentioned patent, one common form of prior art memory cell comprises a plurality of transistors connected to form a bistable flip-flop device. The state of the flip-flop is determined by the voltage levels (i.e. a logical 1 or a logical 0) on the bit and $\overline{\text{bit}}$ lines when the cell is written. The state of the cell (i.e., a logical 1 or a logical 0) is read without disturbing the contents of the cell by accessing the cell and examining, utilizing a suitable sense amplifier of well-known design, the voltage on the bit and $\overline{\text{bit}}$ lines.

It is highly desirable to minimize the cell size, thereby increasing the density of the memory device as a whole. In this manner, a greater number of memory cells are formed on a semiconductor substrate of a given size, thereby providing a memory cell of greater bit storage capacity. Alternatively, a memory cell of a given storage capacity may be formed on a smaller piece of semiconductor substrate, thereby decreasing the cost of the memory device.

Another prior art memory cell of reduced cell size as compared with the structure disclosed in the above-mentioned '660 patent is described in an article by R. Sud and K. C. Hardee entitled "16-K Static RAM Takes New Route to High Speed", *Electronics*, Sept. 11, 1980, pages 117–123, which is hereby incorporated by reference. The schematic diagram for this memory cell is shown in FIG. 1. Memory cell 10 is formed in a bistable flip-flop configuration. Resistors 11 and 12 are connected between a positive voltage source VCC on lead 13 and the gates of MOS transistors 15 and 16, respectively. The gates of N channel MOS transistors 15 and 16 are also connected to the drains of N channel MOS transistors 17 and 18, respectively. The source of transistor 15 is connected to the drain of transistor 18 and the source of transistor 16 is connected to the drain of transistor 17. The drains of transistors 15 and 16 are connected to a voltage supply $V_{SS}$ (typically ground) connected to lead 14. The gates of transistors 17 and 18 are connected to a word line 23, and the source of transistor 17 is connected via lead 21 to bit line 19. Similarly, the source of transistor 18 is connected via lead 22 to $\overline{\text{bit}}$ line 20.

The operation of cell 10 is as follows. When a logical 1 is to be written into cell 10, word line 23 is selected by applying a positive voltage thereto. A logical 1 is placed on bit line 19 and a logical 0 is placed on $\overline{\text{bit}}$ line 20. In this manner, N channel MOS transistors 17 and 18 are turned on, and the low $\overline{\text{bit}}$ signal is applied to the gate of transistor 16, thus turning transistor 16 off. The high signal applied to bit line 19 is applied through transistor 17 to the gate of transistor 15, thus turning transistor 15 on, thus applying ground ($V_{SS}$) to the gate of transistor 16, thus maintaining transistor 16 off. With transistor 16 off, the positive voltage from VCC lead 13 is applied through resistor 11 to the gate of transistor 15, thus maintaining transistor 15 on. Word line 23 is then deselected by placing a low voltage thereon, thus turning off transistors 17 and 18. However, the low $V_{SS}$ signal on lead 14 remains applied to the gate of transistor 16 through conducting transistor 15, thus keeping transistor 16 turned off, which in turn causes the high VCC signal on lead 13 to be applied through resistor 11 to the gate of transistor 15, thus maintaining transistor 15 on. Thus, a logical 1 has been stored in cell 10.

In order to write a logical 0 in cell 10, the above operation is performed with the exception that a logical 0 is applied to bit line 19 and the logical 1 is applied to $\overline{\text{bit}}$ line 20. A logical one is applied to word line 23, thus turning on transistors 17 and 18. Thus, when writing a logical 0 into cell 10, the gate of transistor 15 receives a logical 0 from bit line 19 through transistor 17 and transistor 15 is turned off. Similarly, transistor 16 receives on its gate the logical 1 $\overline{\text{bit}}$ signal from $\overline{\text{bit}}$ line 20 and transistor 16 thus turns on. Word line 23 is then deselected thus causing transistors 17 and 18 to turn off. The $V_{SS}$ signal on lead 14 is applied to the gate of transistor 15 through transistor 16, thus keeping transistor 15 turned off. Because transistor 15 is turned off, the VCC signal from lead 13 is applied through resistor 12 to the gate of transistor 16, thereby maintaining transistor 16 turned on. Thus, a logical zero has been stored in cell 10.

In order to read cell 10, the word line 23 is selected and sense amplifiers (not shown) of a type well known in the art are connected to one or both of bit line 19 and $\overline{\text{bit}}$ line 20, thereby sensing the voltages present on the gates of transistors 15 and 16, respectively, thereby determining the state of cell 10.

In order to minimize the area on the semiconductor substrate required to form cell 10, cell 10 is formed utilizing diffused N+ regions as the source and drain regions of N channel MOS transistors 15, 16, 17 and 18, $V_{SS}$ lead 14, and leads 21 and 22, as well as the interconnecting lead 30 between transistor 16 and transistor 17. A layer of polycrystalline silicon (often referred to as "poly") is used to form resistors 11 and 12, VCC lead 13, word line 23, and the gates of transistors 15, 16, 17 and 18. The three contacts between the N+ diffused regions and the poly regions are shown in FIG. 1 as "Xs" 25, 26 and 27. Bit lines 19 and 20 are formed of metal, typically aluminum or an alloy of aluminum. The contacts from poly leads 21 and 22 to bit line 19 and $\overline{\text{bit}}$ line 20 are shown in FIG. 1 as squares 28 and 29, respectively.

FIG. 2 is a schematic diagram of a plurality of cells illustrating the effect of resistances associated with lead $V_{SS}$ in FIG. 1 on the stability of the data stored within the cells of a memory array. Memory array 40 is comprised of memory cells 1 through n. Resistors R1, R2, through Rn represent the finite resistance values of $V_{SS}$ lead 14 associated with each cell 1, 2 through n. When, as in the case of the circuit of FIG. 1, a diffused region is used as $V_{SS}$ lead 14, the resistances R1, R2 through Rn are rather high, because the sheet resistance of diffused regions are generally at least 20 ohms/square. Typically, the resistance values of resistors R1, R2 through Rn are approximately 300 ohms, and the current which must be sunk by $V_{SS}$ lead 14 when a selected cell 1 through n is accessed is approximately 250 microamps. Of importance, resistance R1 carries the current $I_1$ required to read cell 1, resistance R2 carries the currents $I_1$, $I_2$ required to read cells 1 and 2, respectively, and resistance Rn carries the currents $I_1$, $I_2$ ... $I_N$. Thus, for example, when N=4, where N represents the number of cells in the circuit of FIG. 2, the voltage drop across the series resistance of $V_{SS}$ lead 14 is approximately 75 millivolts for cell 1, and a correspondingly larger amount for cells 2 through 4, with a 300 mV voltage difference across resistor Rn which is a 300 mV difference in the voltages which are available for application to the gate of transistor 15 (through transistor 16) and the gate of transistor 16 (through transistor 15). During reading of the cell, this offset voltage causes a logical zero level on the gate of transistor 16 which is 300 mV greater than the logical zero level on the gate of transistor 15, thus possibly causing, during the read operation, the undesired destruction of data stored within the cell.

SUMMARY

In accordance with this invention, a static RAM cell is constructed utilizing lower resistivity positive and negative power supply leads, thus eliminating the aforementioned problem of instability of the data stored within the cell. In one embodiment of this invention, the negative power supply lead is formed of a first layer of low resistivity polycrystalline silicon/tantalum silicide, and the positive power supply lead is formed of a second layer of polycrystalline silicon. The use of a low resistivity negative power supply lead, causes the voltage drop on the negative power supply lead to be substantially reduced as compared with prior art devices, thereby providing during the read operation substantially equal voltages to the gates of the two bistable transistors of each cell, thus eliminating the problem of instability during reading.

In another embodiment of this invention, depletion load devices are formed utilizing the layer of polycrystalline silicon as the source, drain and channel and the layer of polycrystalline silicon/tantalum silicide as the gate. In this manner, silicon area is not required to form the depletion load devices, thus minimizing cell size.

DETAILED DESCRIPTION

Figure 3:
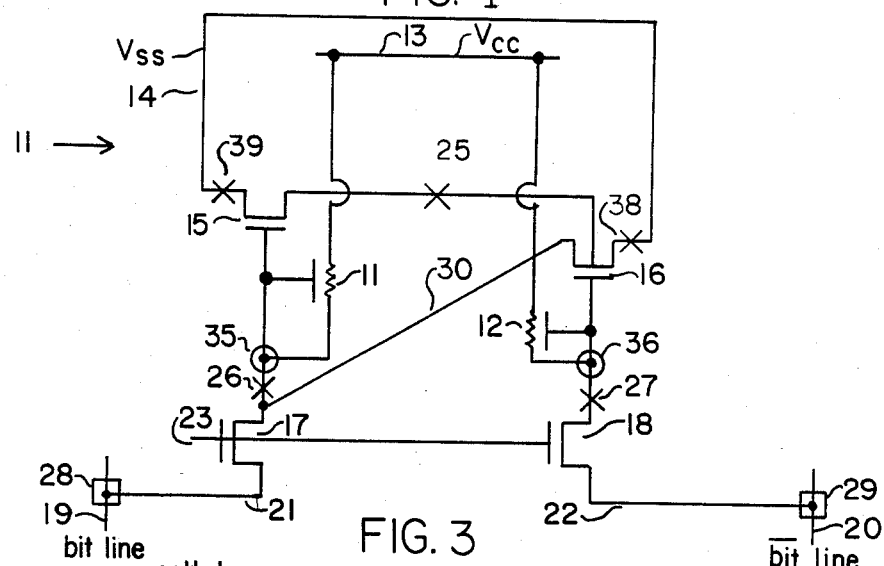
FIG. 3 is a schematic diagram of one embodiment of a static RAM cell constructed in accordance with this invention.

The schematic diagram of one embodiment of a memory cell constructed in accordance with this invention is shown in FIG. 3. Components of memory cell 11 which correspond to components of memory cell 10 (FIG. 1) are numbered with corresponding numbers. The read and write operations of cell 11 are similar to the read and operations of prior art cell 10 (FIG. 1) and thus their description will not be repeated. However, the structure of cell 11 is substantially improved as compared with the prior art structure of FIG. 1. The word line 23, the gates of transistors 15, 16, 17 and 18, and $V_{SS}$ lead 14 are formed of a first layer of low resistivity polycrystalline silicon/tantalum silicide. VCC lead 13 and resistors 11 and 12 are formed of a second layer of polycrystalline silicon. The sources and drains of transistors 15, 16, 17 and 18, as well as leads 21, 22 and 30, are formed of regions of N+ diffusion. The contacts between the first and second layers of polycrystalline silicon are shown in FIG. 3 as circles 35 and 36. The contacts between the first polycrystalline silicon layer and the diffused N+ region are shown in FIG. 3 as "Xs" 26, 27, 38, and 39. The contacts between leads 21 and 22 and metal bit line 19 and metal $\overline{bit}$ line 20 are shown in FIG. 3 as squares 28 and 29, respectively.

Figure 1:
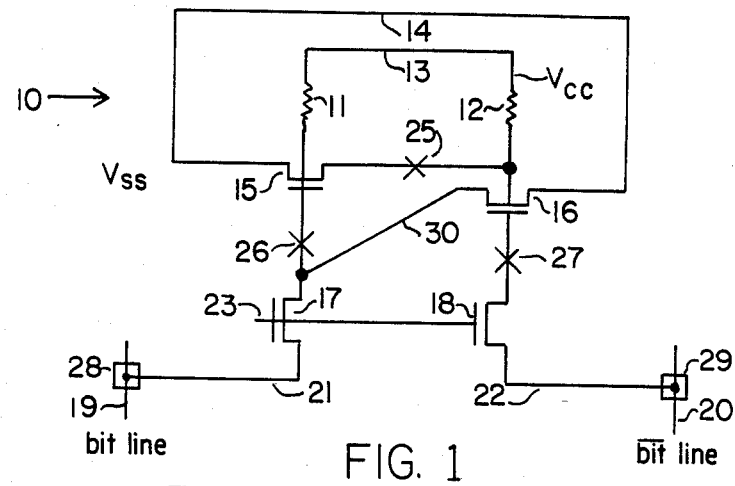
FIG. 1 is a schematic diagram of a prior art static RAM cell.

By minimizing the use of N+ diffused regions within memory cell 11, and particularly by utilizing low-resistivity polycrystalline silicide as $V_{SS}$ lead 14, memory cell 11 of this invention substantially eliminates the series resistance Rs of $V_{SS}$ lead 14, thus substantially eliminating the problems of instability when writing information to memory cell 11, as compared with the instability problem previously described with respect to prior art memory cell 10 (FIG. 1).

Figure 2:
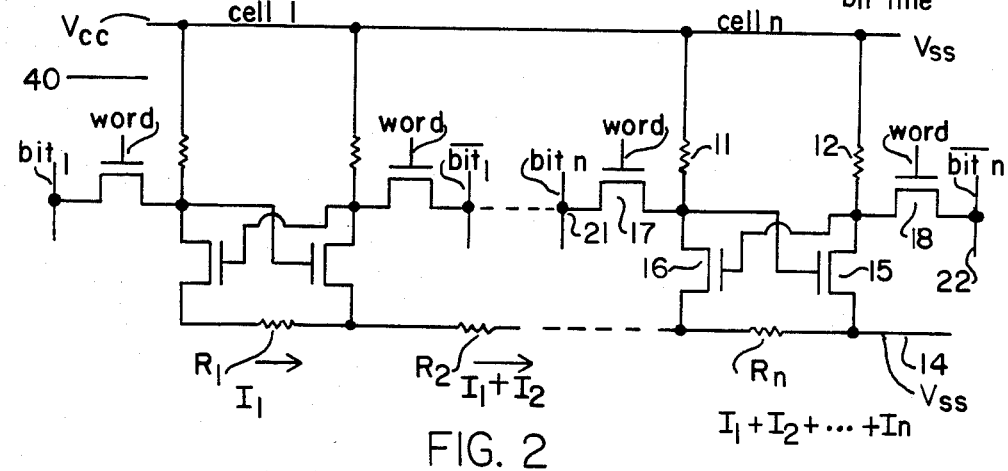
FIG. 2 is a schematic diagram of a portion of a RAM devicce depicting the instability of stored data due to high resistance in the device.

For example, the sheet resistance of polycrystalline silicide, used as $V_{SS}$ lead 14 in this embodiment of our invention, is approximately 4 ohms/square, thus providing a series resistance Rs of $V_{SS}$ lead 14 of approximately 60 ohms per resistor R1 through Rn (FIG. 2). Thus, referring again to FIG. 2, for a cell which requires approximately 250 microamps to be sunk by $V_{SS}$ lead 14 during reading a cell, the voltage across Rs applied to cell 4 of the 4-cell embodiment of FIG. 2 by $V_{SS}$ lead 14 during the reading of cell 4 is typical 60 mV, which is substantially less than the low voltage available during writing a cell of the prior art memory device. Accordingly, the memory cells of this invention will be substantially immune to data failures during the read operation which, in prior art devices, are caused by offset voltages on the gates of transistors 15 and 16 (FIG. 1) as previously described.

Furthermore, the use of a second layer of polycrystalline silicon allows resistors 11 and 12 to be formed as depletion load devices with the second layer of polycrystalline silicon serving as the source, drain and channel and the first layer of polycrystalline silicon/ tantalum silicide serving as the gates of transistors 15 and 16. This allows resistors 11 and 12 to be formed as depletion load transistors which are not formed in the silicon substrate, thus minimizing the size of the silicon substrate required to form the memory device constructed in accordance with this invention. Such a transistor utilizing a diffused region as the gate (as opposed to our use of the first layer of polycrystalline silicon as the gate), is described in a paper by Iizuka et al entitled "Variable Resistance Polysilicon for High Density CMOS RAM" IEDM, 1979, pages 370-373, which is hereby incorporated by reference.

Figure 4A:
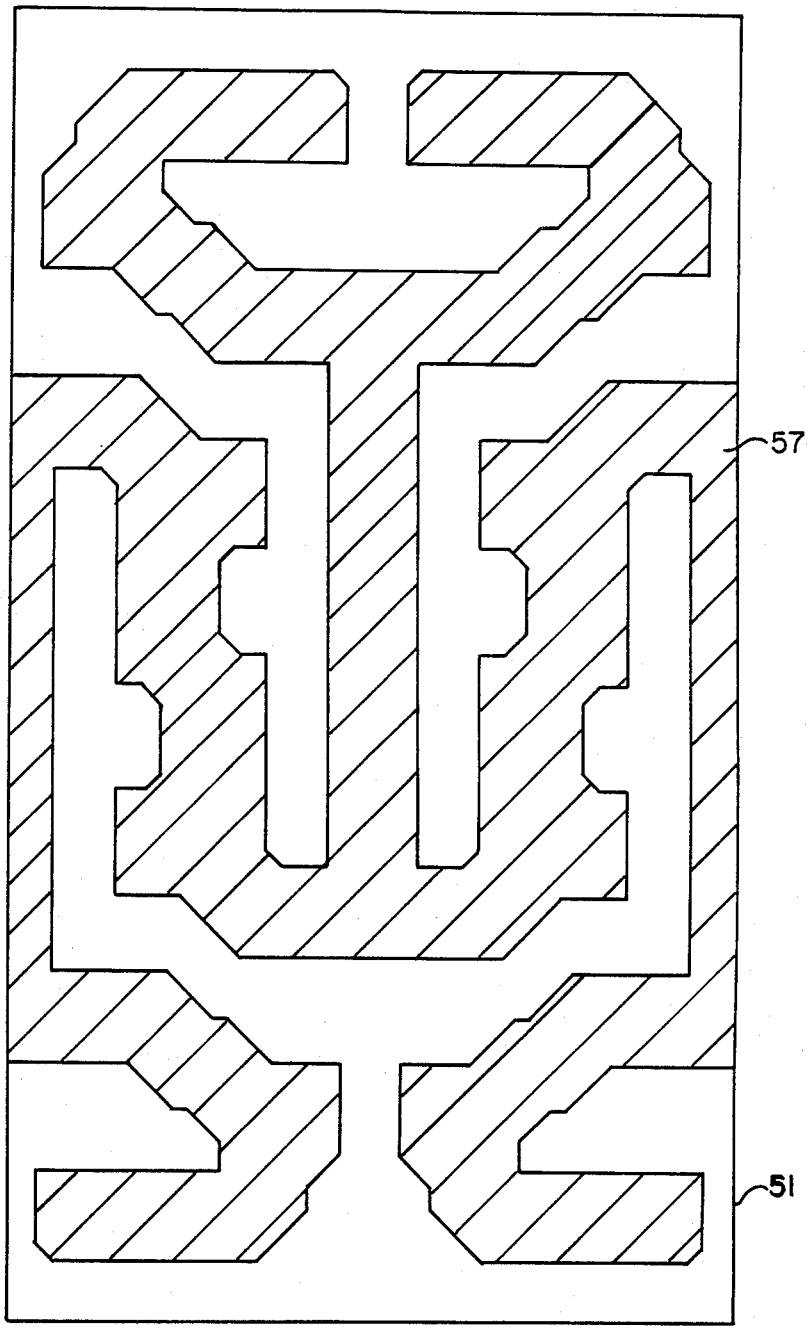
FIGS. 4a-4g are top views of a portion of a RAM device constructed in accordance with one embodiment of this invention.
Figure 4B:
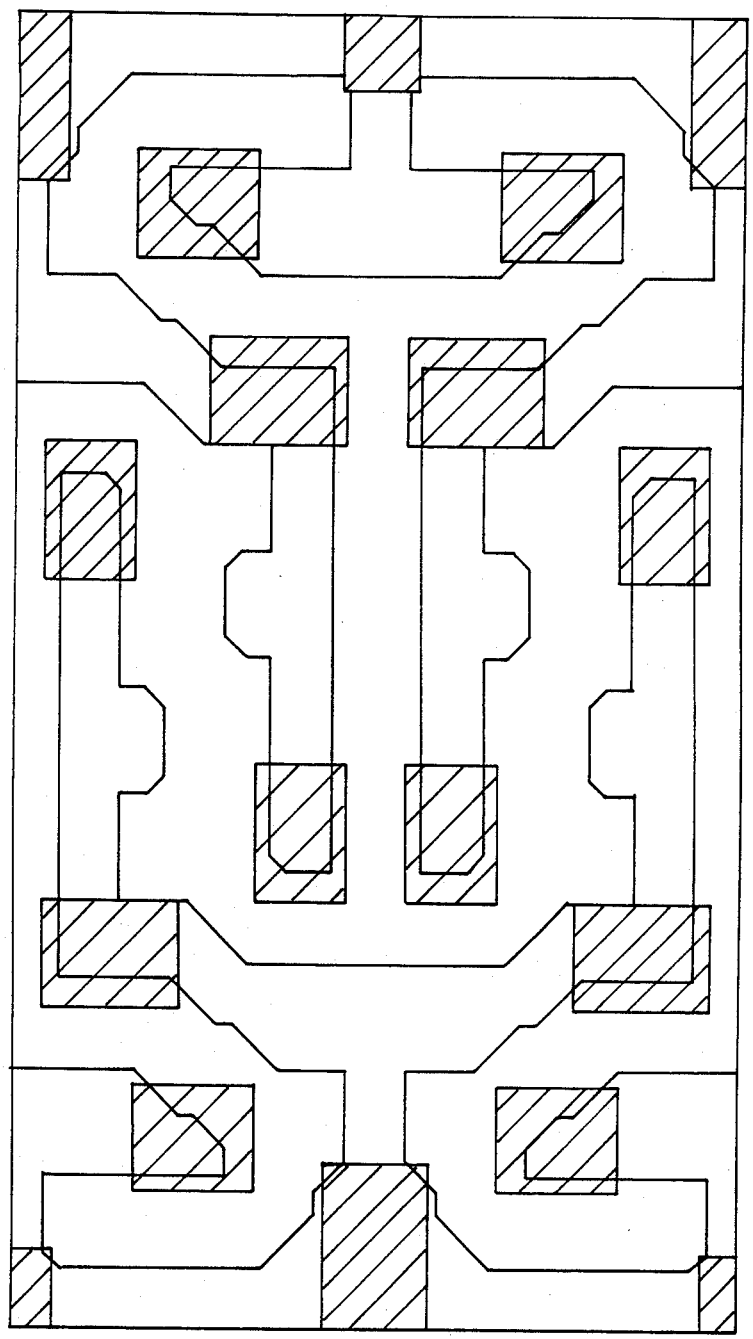
Figure 4C:
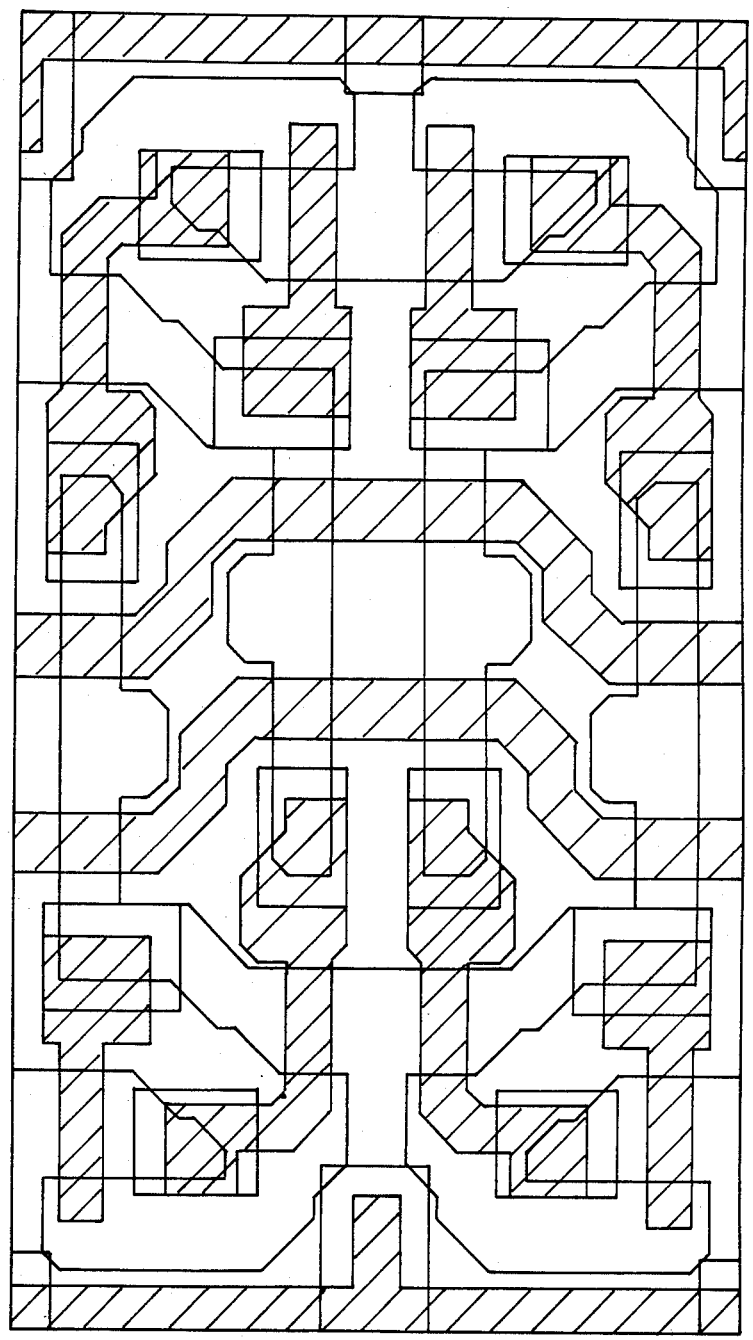
Figure 4D:
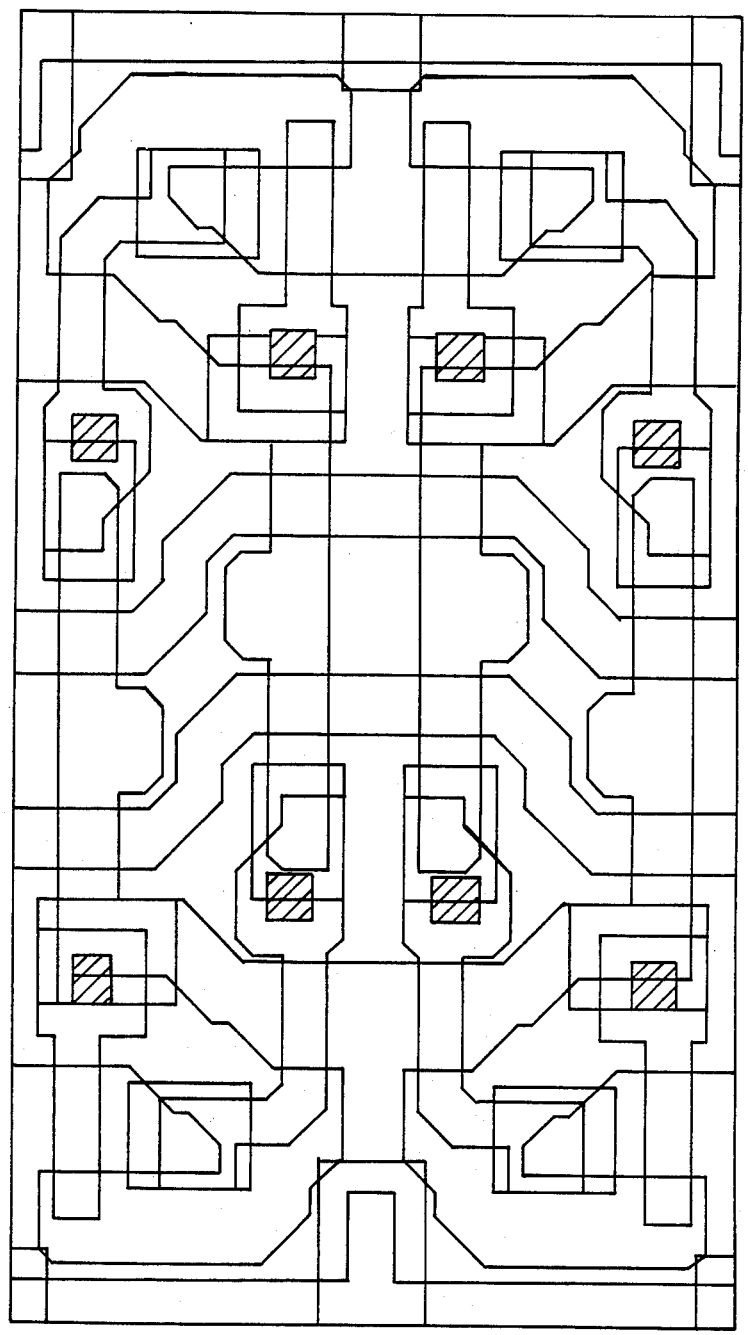
Figure 4E:
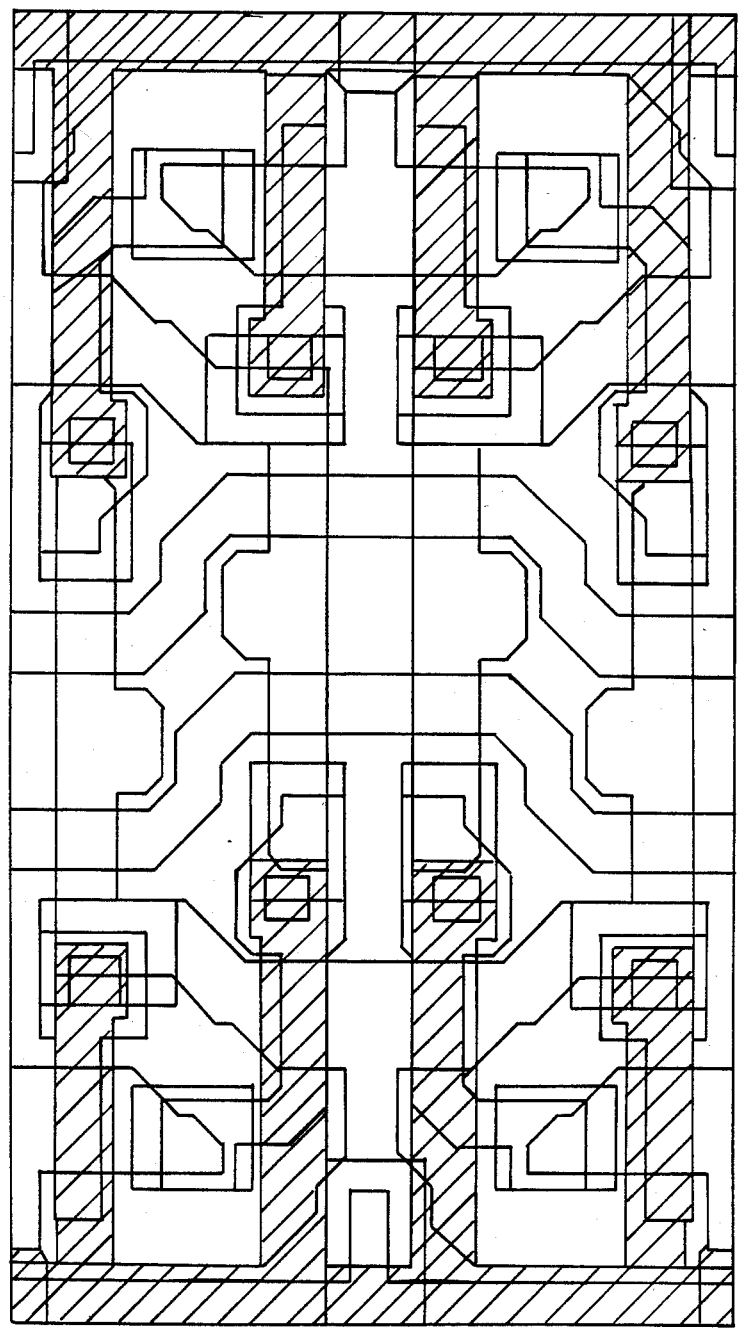
Figure 4F:
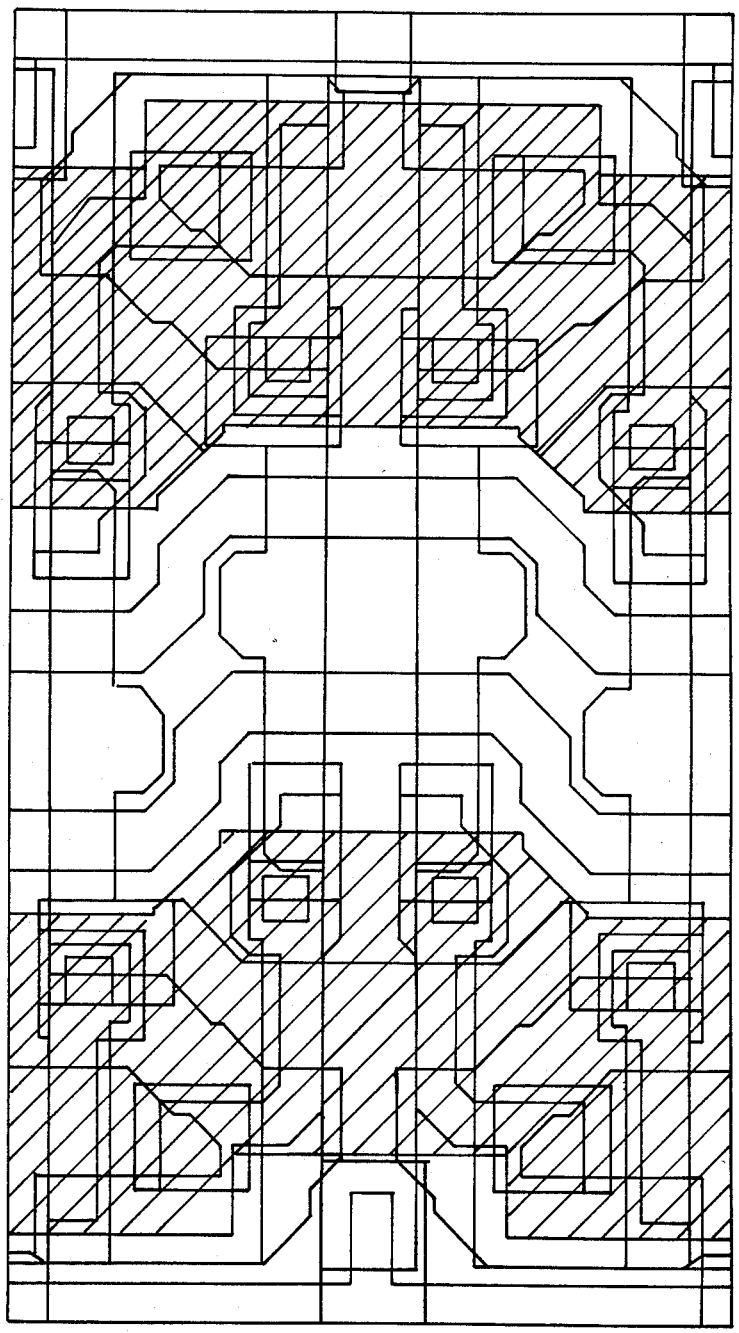
Figure 4G:
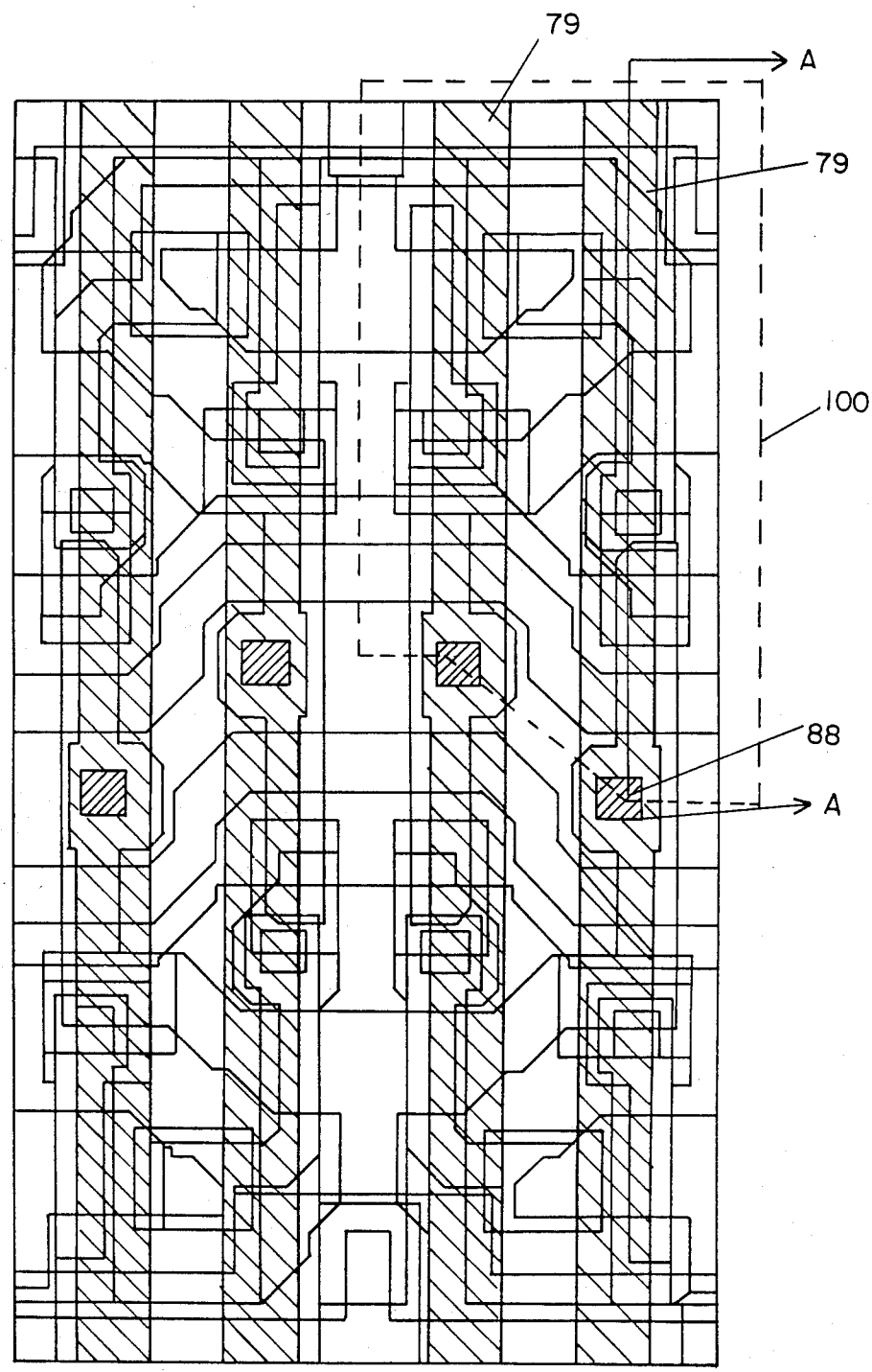

FIG. 4g shows a top view of a portion of an integrated circuit memory device. The portion of the device shown in FIG. 4g contains 4 memory cells, with memory cell 100 shown by the dashed line. The reference numerals of FIG. 4g show the locations of the identically numbered portions of the circuit of FIG. 3.

A memory device utilizing the cells constructed in accordance with this invention is constructed, for example, utilizing the following process steps. Referring to FIGS. 4a through 4g and 5a through 5k, it is seen that this invention is, if desired, fabricated simultaneously with the fabrication of complementary metal oxide silicon (CMOS) devices, thereby allowing CMOS devices to be used as the addressing circuitry, decoding circuitry, output buffers, and other peripheral circuitry, thereby providing a memory device of high speed and low power consumption.

Figure 5A:
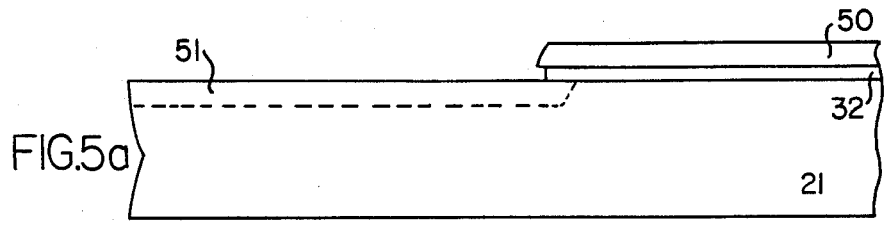
FIGS. 5a-5k are cross-sectional views taken along line A—A of FIG. 4g depicting the construction of the device of FIGS. 4a-4g.

As shown in FIGS. 4a and 5a, substrate 21 comprises an N type silicon wafer of resistivity of approximately 2–4 ohm-cm. Substrate 21 is oxidized forming oxide layer 32 of approximately 3000Å thickness. This oxide layer 32 is formed, for example, by oxidation in wet oxygen at approximately 1000° C. for approximately 50 minutes. A layer of photoresist 50 is then applied to the surface of the wafer and patterned utilizing well-known techniques to define the to-be-formed P well 51. The exposed portion of oxide layer 32 is then etched, for example, with buffered hydrofluoric acid, thus exposing the surface of substrate 21 in the region of to-be-formed P well 51. P type dopants are then introduced into the exposed portion of substrate 21, or example, by ion implantation of boron at approximately 150 KEV to a dosage of approximately $14 \times 10^{12}$ atoms/cm$^2$. The cross-sectional view of substrate 21 at this stage of processing is shown in FIG. 5a.

Figure 5B:
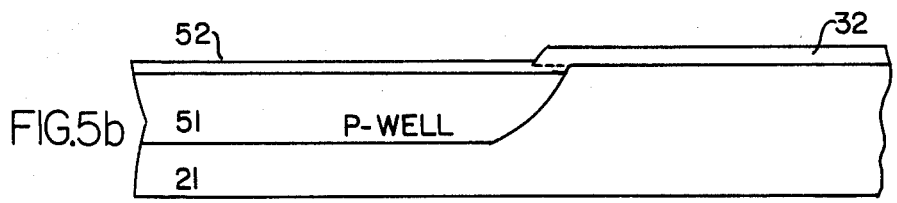

Photoresist 50 is then removed in a well-known manner. Referring now to FIG. 5b, substrate 21 is further oxidized, thus forming oxide region 52 to a thickness of approximately 3000Å. This oxidation is performed by introducing the wafer into a furnace of an ambient of approximately 10% oxygen gas and 90% nitrogen gas at approximately 900° C., and increasing the ambient to approximately 1200° C. within approximately one hour. The wafer is then oxidized in an oxygen ambient containing approximately 3% HCL at approximately 1200° C. for approximately 120 minutes. The wafer is maintained in a nitrogen atmosphere at approximately 1200° C. for approximately 120 minutes, and the ambient temperature is thereafter ramped down to approximately 1000° C. over an approximately 60-minute period, and the ambient temperature is then further ramped down to approximately 900° C. over an approximately 30-minute period. During this oxidation step, oxide layer 32 is increased in thickness to approximately 4500Å, and the dopants within P well 51 are diffused as shown in FIG. 5b. Oxide layers 52 and 32 are then removed, for example, by etching with buffered hydrofluouric acid.

Figure 5C:
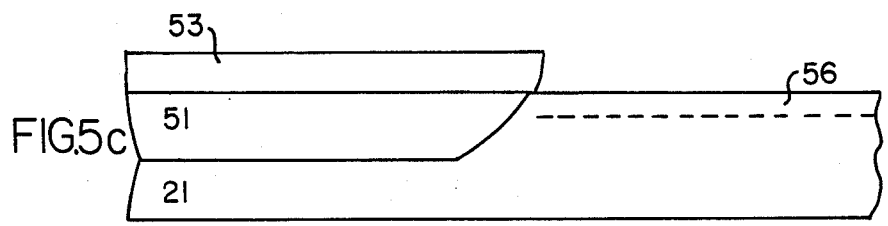

As shown in FIG. 5c, a layer of photoresist 53 is then formed on the surface of substrate 21 and patterned to protect P well 51. N type dopants are then introduced into the exposed portions of substrate 21 in order to increase the N type dopant concentration near the surface of substrate 21, thus allowing the to-be-formed P channel devices to be made with short channel lengths without an undesirably low punch-through voltage. (Punch-through voltage is the voltage between the source and drain regions at which conduction between the source and the drain occurs, when the transistor is turned off.) For example, N type dopants are introduced into N-well region 56 of FIG. 5c by the ion implantation of phosphorous at approximately 200 KEV to a dosage of approximately $1.6 \times 10^{12}$ atoms/cm$^2$. Photoresist 53 is then removed utilizing well-known techniques.

Figure 5D:
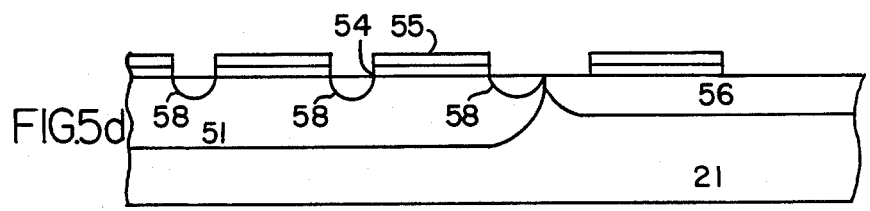

Referring now to FIG. 5d, substrate 21 is oxidized forming an oxide layer 54 of approximately 400Å thickness. This oxidation is performed, for example, by subjecting the substrate to an atmosphere of wet oxygen containing approximately 3% HCL at approximately 900° C. for approximately 16 minutes. A layer of nitride 55 is then formed on the surface of oxide 54 to a thickness of approximately 1000Å. This nitride layer 55 is formed, for example, by low pressure chemical vapor deposition techniques well known in the art and described, for example, by Rosler in an article entitled "Low Pressure CVD Production Processes for Poly, Nitride and Oxide" *Solid State Technology*, April 1977, pages 63–70, and by Brown and Kamins in an article entitled "An Analysis of LPCVD System Parameters for Polysilicon, Silicon Nitride and Silicon Dioxide Deposition", *Solid State Technology*, July 1979, pages 51–57, both of which are hereby incorporated by reference.

A layer of photoresist (not shown) is then formed on the surface of the substrate and patterned in order to expose the portions of the substrate in which isolation regions are to be formed. As shown in FIG. 5d, the exposed portions of nitride layer 55 are then removed, for example, by etching with CF$_4$ plasma. The portions of oxide layer 54 which are exposed after removal of portions of nitride layer 55 are then removed, for example, by etching with a buffered hydrofluoride acid solution. The remaining photoresist is then removed. If desired, dopants are then introduced into the portions of substrate 21 which are exposed by the removal of portions of oxide layer 54 and nitride layer 55, thus providing the highly doped field regions 58 of FIG. 5d, in order to increase the threshold voltage of the field regions of P well 51. For example, this introduction of dopants into the field regions is performed by implanting boron atoms at approximately 50 KEV to a dosage of approximately $5.5 \times 10^{12}$ atoms/cm$^2$. These boron atoms are also introduced into the exposed regions of N well 56, although because the N well 56 has been previously doped to a very high dosage, the presence of a relatively low dosage of boron atoms in the N well 56 is unimportant.

Figure 5E:
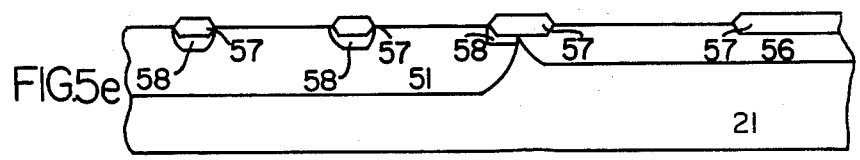

As shown in FIGS. 4a and 5e, field oxide regions 57 are then formed, for example, by subjecting the wafer to an ambient of oxygen gas containing approximately 3% HCL at approximately 920° C. for approximately one hour, followed by an ambient of nitrogen gas at approximately 920° C. for approximately two hours, followed by wet oxygen for approximately four hours at approximately 920° C. This oxidation step causes field oxide 57 to be formed to a thickness of approximately 5500Å and simultaneously causes heavily doped P type guard rings 58 to be diffused as desired. The remaining portions of silicon nitride layer 55 are then removed, for example, by etching with hot phosphoric acid. Thereafter, the remaining portions of oxide layer 54 are then removed, for example, by etching in buffered hydrofluoric acid. The thickness of field oxide regions 57 is decreased slightly during this removal of oxide layer 54, but this slight decrease in the thickness of field oxide 57 is unimportant.

Figure 5F:
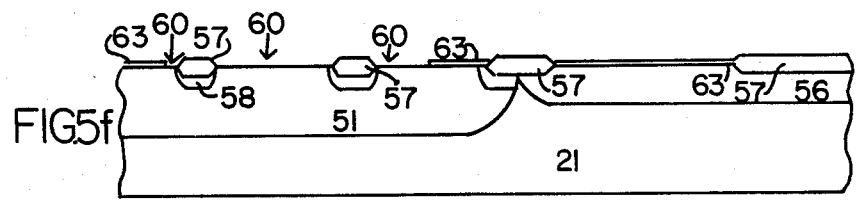

The surface of the wafer is then cleaned, for example, with a sulphuric acid/hydrogen peroxide solution followed by cleaning with a buffered hydrofluoric acid solution. This cleaning removes any impurities and contaminants from the surface of the wafer in preparation for the formation of a thin gate oxide region. The thin gate oxide region 63 of FIG. 5f is then formed to a thickness of approximately 260Å, for example, by subjecting the wafer to a wet oxygen gas at approximately 900° C. for approximately 7 minutes. If desired, an adjustment to the active device threshold voltages is now made, for example, by implanting boron atoms at approximately 50 KEV to a dosage of approximately $1.4 \times 10^{10}$ atoms/cm$^2$. Of importance, field oxide 57 blocks the implant of boron ions during this step, and thus boron atoms are implanted only in the active regions not protected by field oxide 57. Gate oxide 63, being very thin, does not substantially impede the implantation of boron atoms into the active areas of the device. This active device threshold voltage adjustment increases the threshold voltage of the to-be-formed P channel devices to approximately −0.8 volts and simultaneously adjusts the threshold of the to-be-formed N channel devices to approximately +0.8 volts.

A layer of photoresist (not shown) is then applied to the surface of the wafer and patterned in a well-known manner in order to expose to-be-formed buried contacts 60. The gate oxide is then removed from the exposed portions of the wafer, for example, by etching with buffered hydrofluoric acid, thus forming buried contacts 60 (FIGS. 4b and 5f). The remaining photoresist is then removed.

A layer of polycrystalline silicon 67 (hereinafter referred to as "Poly I") is deposited on the surface of the wafer. This Poly I layer is formed, for example, by well-known low pressure chemical wafer deposition techniques (as described, for example, in the above-mentioned articles of Rosler, and Brown and Kamins) to a thickness of approximately 2500Å Poly I is then doped, for example, by heating the wafer for ten minutes to 950° C., exposing the wafer to a POCl$_3$ ambient at approximately 950° C. for approximately five minutes, and ramping the wafer down to approximately room temperature in approximately ten minutes in a nitrogen atmosphere. Poly I is thus doped to a resistivity of approximately 40 ohms/square. A layer of tantalum silicide 61 (hereinafter referred to as silicide) is applied to the surface of the wafer, for example, by sputtering both tantalum and silicon in a well-known manner, thus forming silicide 61 to a thickness of approximately 1700Å. This co-sputtering of tantalum and silicon to form a silicide region is described, for example, by Geipel, et al in an article entitled "Composite Silicide Gate Electrodes-Interconnections for VLSI Device Technologies", *IEEE Transactions on Electron Devices*, Volume ED-27, No. 8, August 1980, pages 1417–1424, which is hereby incorporated by reference. The surface of silicide 61 is then cleaned, for example, with buffered hydrofluoric acid, to remove any contaminants. The silicide is then reacted with Poly I, thus forming a single low resistivity layer of polycrystalline silicon/tantalum silicide (often referred to as polysilicide), having a resistivity of approximately 4 ohms/square. This silicide reaction is performed, for example, by subjecting the wafer to an atmosphere of nitrogen gas at approximately 1000° C. for approximately 30 minutes. For the remainder of this specification, the single layer of polycrystalline silicon/tantalum silicide will be shown as layer 67 in FIGS. 5h, et seq. and will be referred to as "Poly I". As is appreciated by those of ordinary skill in the art, compounds other than tantalum silicide may be used. For example, titanium silicide, tungstun silicide, molybdenum silicide and other metal silicides may be used in place of tantalum silicide.

Figure 5G:
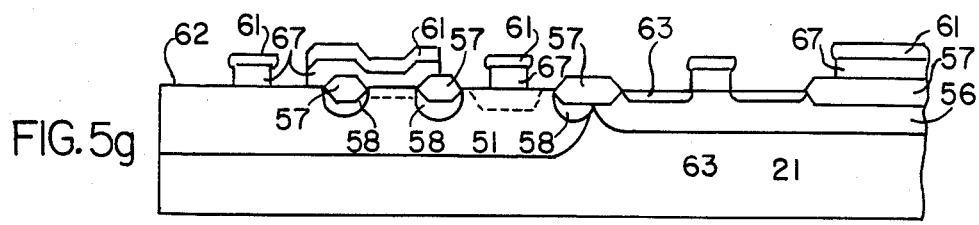

As shown in FIGS. 4c and 5g, a layer of photoresist (not shown) is then applied to the wafer and patterned to define the desired pattern of the Poly I material. The exposed portions of Poly I are then etched, for example, by a CF$_4$ plasma, thus patterning Poly I as desired, as shown in FIG. 5g. The photoresist is then removed. The wafer is then cleaned utilizing, for example, buffered hydrofluoric acid.

A layer of photoresist (not shown) is then applied to the surface of the wafer and patterned to expose the P well 51. The N+ regions 65 (FIG. 5h) are then formed, for example, by implanting arsenic ions at approximately 100 KEV to a dosage of approximately $3 \times 10^{15}$ atoms/cm$^2$. The remaining photoresist is then removed and another layer of photoresist is applied on the surface of the wafer and patterned to expose the N well 56. P+ regions 63 are then formed, for example, by implanting boron ions at approximately 150 KEV to a dosage of approximately $5 \times 10^{15}$ atoms/cm$^2$.

Figure 5H:
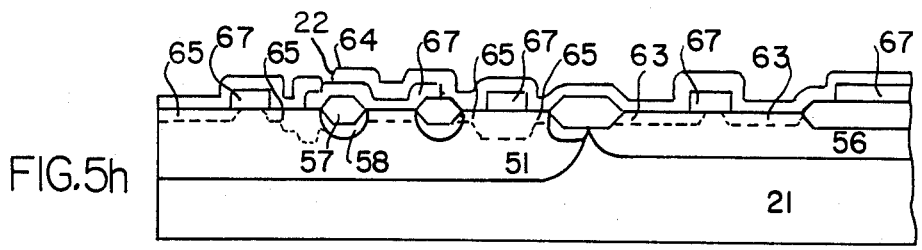

A layer of oxide 64 is then formed on the surface of the wafer. Oxide layer 64 serves to provide electrical insulation between Poly I layer 67 and to-be-formed conductive layers. Of importance, this oxide layer 64 is formed, for example, by a low temperature chemical vapor deposition to a thickness of approximately 2000Å. It is undesirable to oxidize Poly I layer 67 in order to form oxide layer 64 because such an oxidation will decrease the thickness of Poly I. Oxide layer 64 is then "densified" in order to increase the dielectric strength of oxide 64. This "densification" process is performed by subjecting the wafer to an ambient of dry oxygen at approximately 920° C. for approximately 30 minutes. A layer of photoresist (not shown) is then applied to the surface of the wafer and patterned in order to expose those portions of oxide 64 which are to be removed in order to allow electrical contact between Poly I layer 67 and the to-be-formed second layer of polycrystalline silicon. The exposed portions of oxide layer 64 are then removed, for example, by utilizing a CF$_4$ plasma, thus providing contact openings 22 to Poly I (FIGS. 4d and 5h).

Figure 5I:
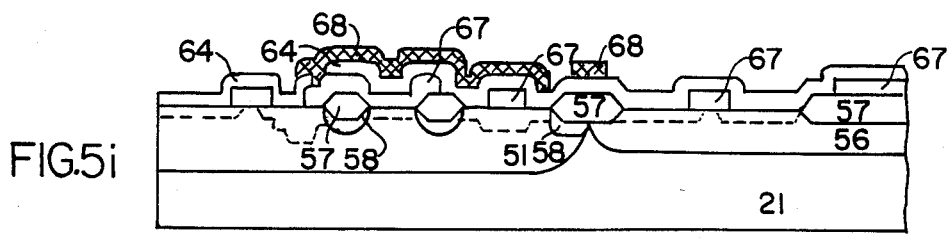
Figure 5J:
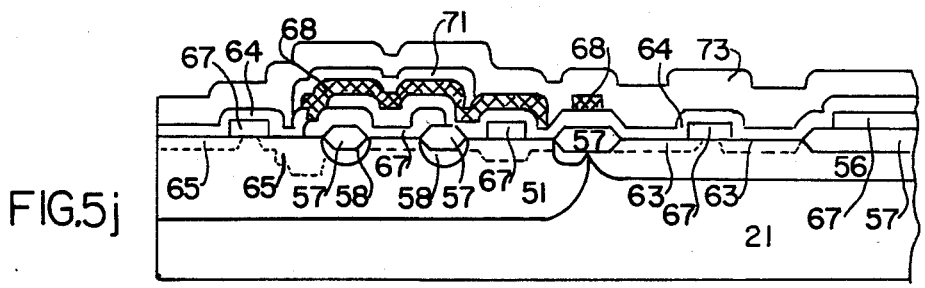

A second layer of polycrystalline silicon 68 (hereinafter referred to as Poly II) is then deposited to a thickness of approximately 2500Å utilizing, for example, well-known low pressure chemical vapor deposition techniques, as previously described. At this time, this Poly II layer 68 has a relatively high resistivity of approximately 10$^9$ ohms/square. A layer of photoresist (not shown) is then formed on the surface of the wafer and patterned to expose those portions of Poly II which are to be removed. The exposed portions of Poly II are then removed, for example, by an isotropic etch utilizing CF$_4$ plasma, thereby providing a patterned layer 68 of Poly II as shown in FIGS. 4e and 5i. An isotropic etch is preferably used to etch Poly II in order to remove all exposed Poly II residue. For example, CF$_4$ plasma is used as the isotropic etch.

A layer of oxide 71 (FIG. 5j) is then formed on the surface of the wafer to a thickness of approximately 1500Å, for example, by low pressure chemical vapor deposition. Oxide layer 71 is then "densified" to increase its dielectric strength, for example by subjecting the wafer to an atmosphere of dry oxygen gas plus approximately 3% HCL at approximately 920° C. for approximately 30 minutes.

Figure 5K:
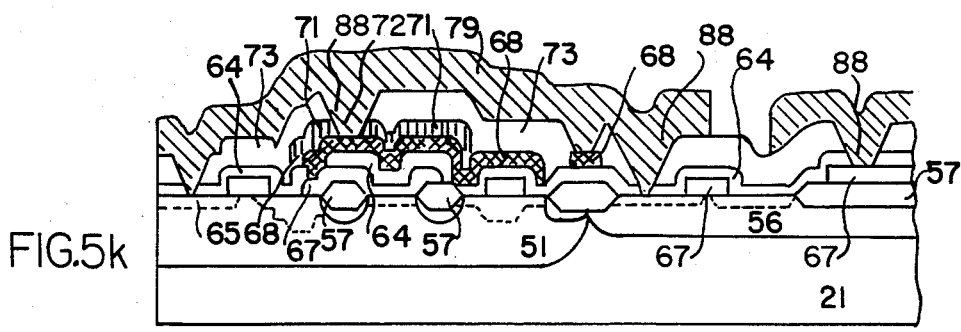

A layer of photoresist (not shown) is then applied to the surface of the wafer and patterned in order to expose those portions of Poly II which are required to have very low resistivity, thereby functioning as electrical interconnects. Of importance, this layer of photoresist protects that portion of oxide 71 which covers that portion of Poly II which is desired to have a high resistivity in order to serve as resistors. The exposed portions of oxide 71 are then removed, for example, by etching with CF$_4$ plasma, thus providing windows 72 as shown in FIG. 4f and 5k. The remaining photoresist is then removed. The exposed portions of Poly II are then doped in order to decrease their resistivity to approximately 100 ohms/square, while the remaining portions of oxide layer 71 prevent the doping of those portions of Poly II which are protected by oxide 71. These undoped relatively high resistivity portions of Poly II serve as resistors 11 and 12 of memory cell 100 (FIG. 3). This doping is performed, for example, by ramping up the temperature of the wafer to approximately 950° C. in a nitrogen atmosphere, exposing the wafer to POCl$_3$ gas at approximately 950° C. for approximately 5 minutes, and ramping down the temperature of the wafer to approximately room temperature within approximately 10 minutes in a nitrogen atmosphere.

A layer of oxide (not shown) is then formed over the surface of the wafer, for example, by subjecting the wafer to a dry oxygen ambient at approximately 900° C. for approximately 30 minutes, thus forming a very thin (approximately 400Å) layer of oxide on the surface of exposed portions of Poly II oxide. This very thin layer of oxide serves to enhance the dielectric stength of the dielectric layer 73 which is formed thereafter. Dielectric layer 73 is formed, for example, by low temperature vapor deposition of oxide to a thickness of approximately 7000Å. Oxide 73 is then "densified", for example, by subjecting the wafer to an ambient of dry oxygen plus approximately 3% HCL at approximately 920° C. for approximately 30 minutes. A layer of photoresist (not shown) is applied to the surface of the wafer and patterned in order to expose those portions of oxide 73 which cover the portions of Poly II to which electrical interconnection is required. As shown in FIGS. 4g and 5k, exposed portions of oxide 73 are then etched thus providing contact openings 88 through oxide 73 to portions of Poly II with the contact openings not having abrupt edges which would interfere with the formation of a continuous low resistivity interconnect thereto. A low resistivity interconnect layer 79, such as aluminum or an alloy of aluminum, is then deposited on the surface of the wafer to a thickness of approximately 7500Å, for example, utilizing well-known sputtering techniques. A layer of photoresist (not shown) is then formed on the surface of the wafer and patterned in order to define the desired metal interconnect pattern. The exposed aluminum is then etched utilizing, for example, Cl$_2$ plasma etch followed by a brief immersion in an aluminum etch (for example a solution of nitric, phosphoric and acetic acids). The remaining aluminum 79 (FIGS. 4g and 5k) is then alloyed in a hydrogen atmosphere at approximately 450° C. for approximately 30 minutes. Scratch protection (not shown) is then applied to the wafer and bonding pad openings formed in a well-known manner, allowing electrical interconnection to other components. The resultant structure is shown in the cross-sectional view of FIG. 5k.

While specific embodiments of our invention have been described, it is to be understood that these embodiments are illustrative and are not to be construed as limitations on the scope of our invention. Many other embodiments of our invention will become apparent to those of ordinary skill in the art in light of the teachings of this specification.

We claim:

1. A semiconductor memory cell capable of storing a single binary digit (bit) comprising:
    a first voltage supply line;
    a second voltage supply line having a sheet resistivity low enough that the resistance of said second voltage supply line when supplying a plurality of cells which are simultaneously selected does not interfere with proper operation of the cells;
    a word line;
    a bit line;
    a $\overline{\text{bit}}$ line;
    a first and a second transistor each having a source and a drain and each having a gate connected to said word line, said source of said first transistor being connected to said bit line and said suurce of said second transistor being connected to said $\overline{\text{bit}}$ line;
    a third and a fourth transistor each having a gate and a drain and each having a source connected to said second voltage supply line;
    said gate of said third transistor being connected to said drain of said first transistor and to said drain of said fourth transistor, said gate of said fourth transistor being connected to said drain of said second transistor and to said drain of said third transistor; and
    a first and a second load device, said first load device connected between said first voltage supply line and said gate of said third transistor, and said second load device connected between said first voltage supply line and said gate of said fourth transistor.

2. Structure as in claim 1 wherein said first voltage supply line comprises polycrystalline silicon.

3. Structure as in claim 1 wherein said second voltage supply line comprises polycrystalline silicon.

4. Structure as in claim 1 wherein said second voltage supply line comprises a first layer of polycrystalline silicon and said first voltage supply line comprises a second layer of polycrystalline silicon located above and spaced apart from said first layer of polycrystalline silicon.

5. Structure as in claim 4 wherein said first layer of polycrystalline silicon also comprises a metal silicide.

6. Structure as in claim 5 wherein said metal silicide is selected from the group consisting of tantalum silicide, titanium silicide, tungsten silicide and molybdenum silicide.

7. Structure as in claim 1 wherein said first and second load devices comprise resistors.

8. Structure as in claim 1 wherein said first and second load devices comprise a first and a second depletion load transistor.

9. Structure as in claim 8 wherein said first depletion load transistor comprises a transistor having its gate and its source connected in common to said gate of said third transistor and its drain connected to said first voltage supply line, and said second depletion load transistor comprises a transistor having its gate and its source connected in common to said gate of said fourth transistor and its drain connected to said first voltage supply line.

10. Structure as in claim 9 wherein each said load transistor comprises a first layer of polycrystalline silicon serving as the source, drain and channel of said load transistor, and a gate formed of polycrystalline silicon located above and electrically insulated from said channel.

11. Structure as in claim 1 wherein the resistance of said second voltage supply line is such that the voltage difference between said sources of said third and said fourth transistors is small with respect to the voltage difference between the gate voltage required to turn on said third transistor and the gate voltage required to turn off said third transistor.

12. Structure as in claim 11 where the voltages required to turn on and off said third transistor are substantially equal to the voltages required to turn on and off said fourth transistor.

13. Structure as in claim 1 where the sheet resistivity of said second voltage supply line is no more than approximately 4 ohms per square.

* * * * *

UNITED STATES PATENT AND TRADEMARK OFFICE
CERTIFICATE OF CORRECTION

PATENT NO. : B1 4,554,644
DATED : July 14, 1992
INVENTOR(S) : Peter C. Chen et al.

It is certified that error appears in the above - identified patent and that said Letters Patent is hereby corrected as shown below:

In Col. 1, line 40, change "bit" to --$\overline{bit}$--.
In Col. 1, line 46, change "bit" to --$\overline{bit}$--.
In Col. 2, line 32, change "bit" to --$\overline{bit}$--.
In Col. 2, line 37, change "bit" to --$\overline{bit}$--.
In Col. 2, line 46, insert --a-- between "and" and "second"
  to read "...a first and $\underline{a}$ second load device...".

Signed and Sealed this

Second Day of November, 1993

Attest:

BRUCE LEHMAN

*Attesting Officer*    *Commissioner of Patents and Trademarks*

REEXAMINATION CERTIFICATE (1744th)
United States Patent [19]
Chen et al.

[11] B1 4,554,644
[45] Certificate Issued   Jul. 14, 1992

[54] STATIC RAM CELL

[75] Inventors: Peter C. Chen, Sunnyvale; Alex Au, Los Altos, both of Calif.

[73] Assignee: Fairchild Camera and Instrument Corporation, Mountain View, Calif.

Reexamination Request:
No. 90/002,294, Mar. 11, 1991

Reexamination Certificate for:
Patent No.: 4,554,644
Issued: Nov. 19, 1985
Appl. No.: 390,082
Filed: Jun. 21, 1982

[51] Int. Cl.⁵ .............................. G11C 11/40
[52] U.S. Cl. .................... 365/154; 365/190
[58] Field of Search .......... 365/154, 190, 202

[56] References Cited
U.S. PATENT DOCUMENTS

| | | | |
|---|---|---|---|
| 3,772,660 | 11/1973 | Norman | 365/155 |
| 4,102,733 | 7/1978 | De La Moneda et al. | 156/653 |
| 4,110,776 | 8/1978 | Rao et al. | 357/51 X |
| 4,129,936 | 12/1978 | Takei | 29/571 |
| 4,183,040 | 1/1980 | Rideout | 357/41 |
| 4,214,917 | 7/1980 | Clark et al. | 148/1.5 |
| 4,240,097 | 12/1980 | Raymond, Jr. | 357/71 |
| 4,240,195 | 12/1980 | Clemens et al. | 29/571 |
| 4,246,593 | 1/1981 | Bartlett | 357/41 |
| 4,247,915 | 1/1981 | Bartlett | 365/154 |
| 4,291,328 | 9/1981 | Lien et al. | 357/59 |
| 4,292,730 | 10/1981 | Ports | 29/577 |
| 4,326,213 | 4/1982 | Shirai et al. | 357/51 |
| 4,329,706 | 5/1982 | Crowder et al. | 357/71 |
| 4,342,101 | 7/1982 | Edwards | 365/154 |
| 4,392,150 | 7/1983 | Courreges | 357/51 |
| 4,399,451 | 8/1983 | Shirai | 357/59 |
| 4,453,175 | 6/1984 | Ariizumi et al. | 357/41 |
| 4,481,524 | 11/1984 | Tsujide | 357/42 |

FOREIGN PATENT DOCUMENTS

| | | |
|---|---|---|
| 21400 | 7/1981 | European Pat. Off. |
| 55161 | 6/1982 | European Pat. Off. |
| 66-049562A | 7/1981 | Japan |
| 56-51853 | 9/1981 | Japan |
| 56-074965A | 9/1981 | Japan |
| 57-56958 | 5/1982 | Japan |
| 57-73968 | 8/1982 | Japan |

OTHER PUBLICATIONS

Linton et al., "Low-Power FET Storage Cell", IBM Tech. Disc. Bull., vol. 17, No. 11, Apr. 1975, pp. 3338–3339.
Rahul Sud et al., "16-K Static RAM Takes New Route
(List continued on next page.)

Primary Examiner—Joseph A. Popek

[57] ABSTRACT

A static RAM cell (11) is constructed utilizing low resistivity positive and negative power supply leads (13,14), thus eliminating the problem of instability of the data stored within the cell. The negative power supply lead is formed of a first layer of low resistivity polycrystalline silicon/tantalum silicide, and the positive-power supply lead is formed of a second layer of polycrystalline silicon. The use of a low resistivity negative power supply lead causes the voltage drop on the negative power supply lead to be substantially reduced as compared with prior art devices, thereby providing during the read operation substantially equal voltages to the gates of the two bistable transistors of each cell, thus eliminating the problem of instability during reading.

Depletion load devices (11,12) are formed utilizing the layer of polycrystalline silicon as the source, drain and channel and the layer of polycrystalline silicon/tantalum silicide as the gate. In this manner, silicon area is not required to form the depletion load devices, thus minimizing cell size.

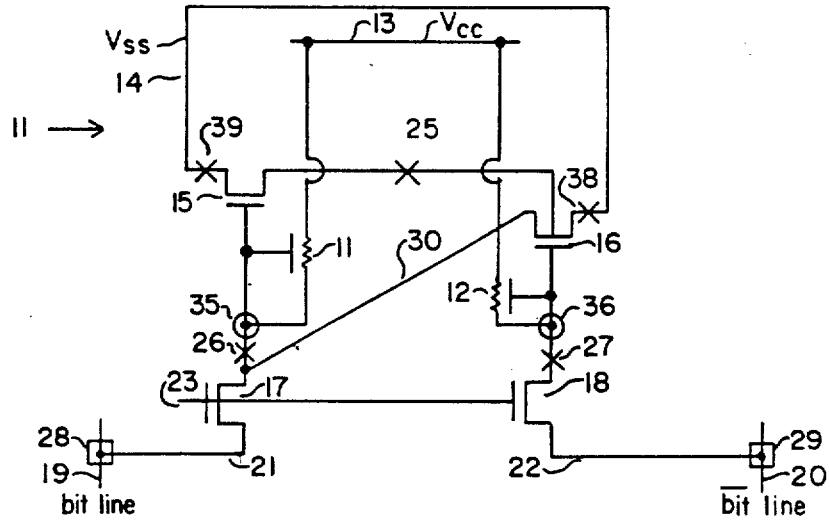

OTHER PUBLICATIONS to High Speed", Electronics, Sep. 11, 1980, pp. 117–123.

Toshio Wada et al., "A 15-ns 1024-Bit Fully Static MOS RAM", IEEE Journal of Solid-State Circuits, vol. SC-13, No. 5, Oct. 1978, pp. 635–639.

T. Iizuka et al., "Variable Resistance Polysilicon for High Density CMOS RAM", IEEE 1979, CH1504-0/79/0000-0370$00.75, pp. 370–373.

S. S. Liu et al., "A High Performance MOS Technology for 16K Static RAM", IEEE 1979, CH1504-0/79/0000-0352$00.75, pp. 352–354.

T. Ohzone et al., "An 8K×8 Bit Static MOS RAM Fabricated by n-MOS/n-Well CMOS Technology, 1980, IEEE, Journal of Solid-State Circuits, vol. SC-15, No. 5, Oct. 1980, pp. 854–861.

H. J. Geipel, Jr. et al., "Composite Silicide Gate Electrodes-Interconnections for VLSI Device Technologies", IEEE Transactions on Electron Devices, vol. ED-27, No. 8, Aug. 1980, pp. 1417–1424.

C. Furnweger, "Dynamic Interfacing, Spare Cells Raise 16-K Static RAM's Speed and Yield", Electronics, Mar. 24, 1982, pp. 121–124.

Hardee et al, "A Fault-Tolerant 30 ns/375 mW 16K×1 NMOS Static RAM", IEEE Journal of Solid State Circuits, vol. SC-16, No. 5, Oct. 1981.

Kang et al, "A 30 ns 16K×1 Fully Static RAM", IEEE Journal of Solid State Circuits, vol. SC-16, No. 5, Oct. 1981.

Kang et al, "A 30 ns 16×1 Fully Static RAM", ISSCC81, Feb. 18, 1981.

Minato et al, "A High Speed Hi-CMOSII 4K Static RAM", IEEE Journal of Solid State Circuits, vol. SC-16, No. 5, Oct. 1981.

Minato et al, "Hi-CMOSII 4K Static RAM", IEEE International Solid State Circuits Conference, Feb. 18, 1981.

Minato et al, "A Hi-CMOSII 8K×8 Bit Static RAM", Journal of Solid State Circuits, vol. SC-17, No. 5, Oct. 1982.

Minato et al, "A Hi-CMOSII 8K×8b Static RAM", 1982 IEEE Solid State Circuits Conference, Feb. 12, 1982.

V. L. Rideout, "Future Directions in MOSFET Random Access Memories", IEEE International Conference on Circuits and Computers, Oct. 1-3, 1980.

Ishikawa et al, "An Mo Gate 4K Static MOS RAM", IEEE Journal of Solid State Circuits, vol. SC-15, No. 4, Aug. 1980.

Minato et al, "2K×8 Bit Hi-CMOS Static RAM's", IEEE Journal of Solid State Circuits, vol. SC-15, No. 4, Aug. 1980.

Masuhara et al, "2K×8b HCMOS Static RAMs", 1980 IEEE International Solid State Circuits Conference, Feb. 15, 1980.

Ohzone et al, "A 64Kb Static RAM", IEEE International Solid State Circuits Conference, Feb. 15, 1980.

Yu et al, "HMOS-CMOS—A Low-Power High-Performance Technology", IEEE Journal of Solid State Circuits, vol. SC-16, No. 5, Oct. 1981.

Isobe et al, "An 18ns CMOS/SOS 4K Static RAM", IEEE Journal of Solid State Circuits, vol. SC-16, No. 5, 1981.

Wade et al, "A 16 DIP, 64 kbit, Static MOS-RAM", IEEE Journal of Solid State Circuits, vol. SC-16, No. 5, Oct. 1981.

Wade et al, "A 16-DIP 64Kb Static MOS RAM", IEEE International Solid State Circuits Conference, Feb. 18, 1981.

Ochii et al, "An Ultralow Power 8K×8-Bit Full CMOS RAM with a Six-Transistor Cell", IEEE Journal of Solid State Circuits, SC-17, No. 5, Oct. 1982.

Uchida et al, "A Low Power Resistive Load 64 kbit CMOS RAM", IEEE Journal of Solid State Circuits, vol. SC-17, No. 5, Oct. 1982.

Liu et al. "HMOS III Technology", IEEE Journal of Solid State Circuits, vol. SC-17, No. 5, Oct. 1982.

Anami et al, "A 35 ns 16K NMOS Static RAM", IEEE Journal of Solid State Circuits, vol. SC-17, No. 5, Oct. 1982.

Mirimoto et al, "High Speed 4 kbit Static RAM with Silicide Coated Wire", Proceedings of the 12th Conference on Solid State Devices, Tokyo, Aug. 26-27, 1980.

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 3 and 4 are cancelled.

Claims 1, 5 and 10 are determined to be patentable as amended.

Claims 2, 6 to 9, and 11 to 13, dependent on an amended claim, are determined to be patentable.

New claim 14 is added and determined to be patentable.

1. A semiconductor memory cell capable of storing a single binary digit (bit) comprising:
   a first voltage supply line;
   a second voltage supply line *comprising polycrystalline silicon* having a sheet resistivity low enough that the resistance of said second voltage supply line when supplying a plurality of cells which are simultaneously selected does not interfere with proper operation of the cells;
   a word line;
   a *bit* line;
   a bit line;
   a first *transistor* and a second transistor each having a source and a drain and each having a gate connected to said word line, said source of said first transistor being connected to said bit line and said [suurce]. *source of* said second transistor being connected to said bit line;
   a third and a fourth transistor each having a gate and a drain and each having a source connected to said second voltage supply line;
   said gate of said third transistor being connected to said drain of said first transistor and to said drain of said fourth transistor, said gate of said fourth transistor being connected to said drain of said second transistor and to said drain of said third transistor; and
   a first *load device* and a second load device, said first load device connected between said first voltage supply line and said gate of said third transistor, and said second load device connected between said first voltage supply line and said gate of said fourth transistor[.]
   *wherein said first voltage supply line is located above and spaced apart from said second voltage supply line in the semiconductor memory cell.*

5. Structure as in claim [4] *1* wherein said first layer of polycrystalline silicon also comprises a metal silicide.

10. Structure as in claim 9 wherein each said load transistor comprises a first layer of polycrystalline silicon serving as the source, drain and channel of said load transistor, and a gate formed of polycrystalline silicon located [above] *below* and electrically insulated from said channel.

*14. A semiconductor memory cell capable of storing a single binary digit (bit) comprising:*
   *a first voltage supply line comprising one layer of polycrystalline silicon;*
   *a second voltage supply line comprising another layer of polycrystalline silicon having a sheet resistivity low enough that the resistance of said second voltage supply line when supplying a plurality of cells which are simultaneously selected does not interfere with proper operation of the cells;*
   *a word line;*
   *a bit line;*
   *a bit line;*
   *a first and second transistor each having a source and a drain and each having a gate connected to said word line, said source of said first transistor being connected to said bit line and said source of said second transistor being connected to said bit line;*
   *a third and a fourth transistor each having a gate and a drain and each having a source connected to said second voltage supply line;*
   *said gate of said third transistor being connected to said drain of said first transistor and to said drain of said fourth transistor, said gate of said fourth transistor being connected to said drain of said second transistor and to said drain of said third transistor; and*
   *a first and second load device, said first load device connected between said first voltage supply line and said gate of said third transistor, and said second load device connected between said first voltage supply line and said gate of said fourth transistor;*
   *wherein said first voltage supply line is located above and spaced apart from said second voltage supply line in the semiconductor memory cell.*

* * * * *